United States Patent
Liu et al.

(10) Patent No.: US 6,562,731 B2
(45) Date of Patent: *May 13, 2003

(54) METHOD FOR FORMING DIELECTRIC LAYERS

(75) Inventors: Chih-Chien Liu, Taipei (TW); Juan-Yuan Wu, Hsinchu (TW); Water Lur, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 24 days.

This patent is subject to a terminal disclaimer.

(21) Appl. No.: 09/752,470

(22) Filed: Jan. 2, 2001

(65) Prior Publication Data

US 2001/0001191 A1 May 17, 2001

Related U.S. Application Data

(63) Continuation of application No. 09/241,326, filed on Feb. 1, 1999, now Pat. No. 6,239,018.

(51) Int. Cl.$^7$ ................................................ H01L 21/31
(52) U.S. Cl. ........................ 438/778; 438/788; 438/622; 438/680; 427/569; 427/99
(58) Field of Search ................................. 438/624, 680, 438/778, 787, 788, 622; 427/564, 94, 100

(56) References Cited

U.S. PATENT DOCUMENTS 5,756,396 A * 5/1998 Lee et al. .................... 438/625
5,966,600 A * 10/1999 Hong .......................... 438/253
6,239,018 B1 * 5/2001 Liu et al. ..................... 438/624

* cited by examiner

*Primary Examiner*—Bret Chen

(57) ABSTRACT

A method for forming dielectric layers is described. Wiring lines are formed on a provided semiconductor substrate. Spacers are formed on the sidewalls of the wiring lines. A liner layer is formed on the wiring lines and on the spacers by a first HDPCVD step, such as unbiased, unclamped HDPCVD. A dielectric layer is formed on the liner layer to cover the wiring lines and to fill gaps between the wiring lines by a second HDPCVD step.

4 Claims, 1 Drawing Sheet

METHOD FOR FORMING DIELECTRIC LAYERS

This application is a continuation application of, and claims the priority benefit of, U.S. application Ser. No. 09/241,326 filed on Feb. 1, 1999 now U.S. Pat. No. 6,239,018.

BACKGROUND OF THE INVENTION

1. Field of the Invention

The invention relates in general to a fabrication for semiconductor devices, and more particularly to a method for forming inter-metal dielectric (IMD) layers or interlayer dielectric (ILD) layers.

2. Description of the Related Art

Inter-metal dielectric layers are generally used to separate and electrically isolate wiring lines and other conductors in semiconductor circuit devices. Such devices may include multiple layers of wiring lines and other conductors and require isolation between adjacent conducting structures and isolation between layers. As devices are being scaled down to smaller geometries, the gaps between wiring lines generally have higher aspect ratios (ratio of height to width), which are harder to fill than small aspect ratio gaps. In addition, as the distance between wiring lines and other conductors becomes smaller, capacitive coupling between wiring lines and other conductors becomes a limitation on the speed of the integrated circuit device. For adequate device performance in reduced dimension devices, it is necessary for the dielectric provided between wiring lines to meet a number of requirements. The dielectric material should be able to completely fill the gap between conductors and should be planarizable so that successive layers can be deposited and processed. The dielectric material should also be resistant to moisture transport and have a low dielectric constant to minimize wiring capacitance between conductors and between layers.

It is extremely important to deposit a high quality, substantially void-free dielectric that can fill the small, high-aspect ratio gaps between wiring lines. Dielectric layers for wiring line isolation are often formed by chemical vapor deposition (CVD) processes, which deposit material onto a surface by transporting certain gaseous precursors to the surface and causing the precursors to react at the surface. Common CVD methods include atmospheric-pressure CVD (APCVD), low-pressure CVD (LPCVD) and plasma-enhanced CVD (PECVD). High quality APCVD and LPCVD oxides may be deposited at high temperatures (650–850° C.), but such temperatures are generally not compatible with preferred wiring materials such as aluminum or copper. Lower temperature APCVD and LPCVD processes tend to yield oxides that are comparatively more porous and water absorbing and that may be poorly suited to use as inter-metal dielectrics. Acceptable oxides may be formed using PECVD processes, which use a plasma to impart additional energy to the reactant gases. The additional energy supplied by the plasma enables PECVD processes to be carried out at lower temperatures (approximately 400° C. and less) than APCVD or LPCVD processes.

As devices are being scaled down to smaller geometries, conventional CVD techniques cannot adequately fill the high aspect ratio gaps between wiring lines (or other conducting structures) on a substrate surface. Conventional techniques such as PECVD tend to deposit material in a manner such that voids become enclosed between the wiring lines. Such voids may be uncovered during subsequent processing and result in contamination that can damage wiring lines or contacts, diminishing device performance.

High density plasma chemical vapor deposition (HDPCVD) allows for the addition of a sputter component to a plasma deposition process which can be controlled to promote gap-filling, during deposition processes in a manner superior to conventional CVD processes. HDPCVD deposits a dielectric layer having superior density, moisture resistance and planarization properties as compared to conventional CVD dielectric layers. The bias sputtering component of HDPCVD derives from the introduction of an accelerating potential between the plasma-excited deposition gases and the deposition substrate. The ions accelerated through the bias sputter component of HDPCVD processes etch the material present on the surface of the deposition substrate and sputter the etched material, generally to further recessed portions on the substrate. As an oxide is deposited onto the surface of a substrate by HDPCVD incorporating bias sputtering, the oxide is also etched from the surface of the substrate and sputtered into recessed portions of the substrate. As such, those portions of a deposited layer that are closest to a gap are the most likely to be etched and sputtered into the gap. This produces the well-known surface faceting of the HDPCVD process and the ability of the process to fill gaps effectively.

HDPCVD processes may accomplish both deposition and etching at the same time, depending on the level of bias sputter component chosen for the deposition environment during the process. Bias sputtering removes and redistributes dielectric material from wiring line sidewalls and enables substantially void-free filling of gaps and enhances planarization. As described above, the sputter component acts to prevent material build-up at the corners of the wiring lines and results in better gap-filling. It should be noted that an excessive etching component during HDPCVD dielectric deposition may damage wiring lines.

SUMMARY OF THE INVENTION

It is therefore an object of the invention to provide a method for forming dielectric layers to avoid wiring lines being damaged from the sputtering component of HDPCVD. Wiring lines are formed on a provided semiconductor substrate. Spacers are formed on the sidewalls of the wiring lines. A liner layer is formed on the wiring lines and on the spacers by a first HDPCVD step, such as unbiased unclamped HDPCVD. A dielectric layer is formed on the liner layer to cover the wiring lines and to fill gaps between the wiring lines by a second HDPCVD step.

In the invention, the liner layer is formed by unbiased HDPCVD so that the sputtering component of HDPCVD is removed. The liner layer protects the wiring lines from being damaged. The dielectric layer fills the gaps between the wiring lines without any void and provides a planarized surface.

BRIEF DESCRIPTION OF THE DRAWINGS

Other objects, features, and advantages of the invention will become apparent from the following detailed description of the preferred but non-limiting embodiments. The description is made with reference to the accompanying drawings in which:

FIGS. 1 to 3 illustrate the processing steps of one preferred embodiment of the method for forming dielectric layers, wherein FIG. 1 shows a schematic, cross-sectional view of a semiconductor substrate 10 having wiring lines 12 thereon;

FIG. 2 shows that a thin liner layer 16 is formed on the spacers 14 and the wiring lines 12 after the first HDPCVD step is carried out; and FIG. 3 shows that a dielectric layer 18 is formed to fill the gaps between the wiring lines 12 after the second HDPCVD step is carried out with the substrate being biased.

DESCRIPTION OF THE PREFERRED EMBODIMENT

An excessive etching component used during HDPCVD dielectric deposition may damage wiring lines. Thus, the sputter component is preferably controlled or other process characteristics are adjusted to protect the wiring lines and desired portions of the inter-metal dielectric. Favorable gap-filling with dielectric materials can be accomplished by using a two step HDPCVD process as described below in which the etching and sputtering rates are most preferably different in each of the two steps.

It should be appreciated that, while the present invention is described with reference to a particularly preferred embodiment in which two distinct stages of deposition are performed, variations on the process having more stages or even providing continuous variation between different etching and sputtering conditions may be desirable. These more complicated implementations of the present invention are presently less preferred because of their greater complexity and increased process variability. The two layers (including a liner layer and a dielectric layer) of the preferred gap fill structure perform particularly desirable functions in the invention's method. The liner layer deposited near the wiring lines (or other conductors) is formed in a HDPCVD process having no bias sputtering component to provide a layer in a substantially conformal manner. The dielectric layer is preferably provided over the liner layer with a sputtering component to provide high gap-filling at a desirable deposition rate. The presently preferred embodiments utilize oxides for each layer within the gaps between the wiring lines, but it would be possible to utilize other materials if appropriate deposition techniques were available.

Figure 1:
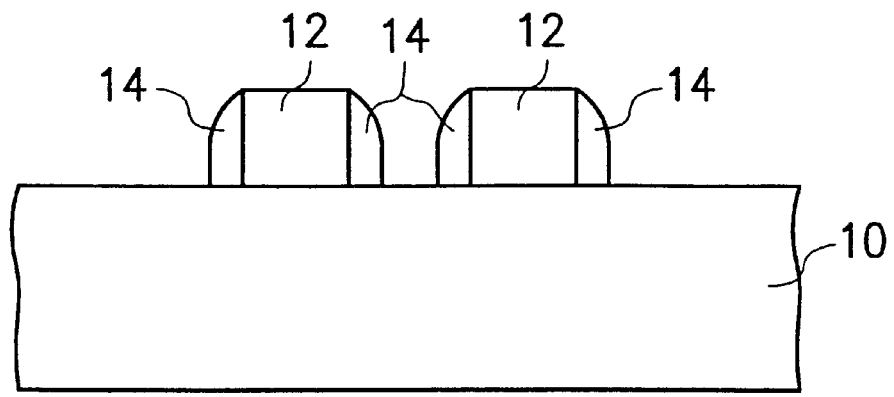

A preferred embodiment of the present invention is now described with reference to FIGS. 1–3. FIG. 1 shows a schematic, cross-sectional view of a semiconductor substrate 10 having wiring lines 12 thereon. The wiring lines 12 may be formed from a variety of materials, such as aluminum, aluminum alloyed with silicon or copper, alloys including copper, and multi-layer structures including comparatively inexpensive metals and more expensive metals such as the refractory metals. Between the wiring lines 12 lie gaps (not shown). The substrate 10 may contain a variety of elements, including, for example, transistors diodes, and other semiconductor elements (not shown) as are well known in the art. The substrate 10 may also include other metal interconnect layers. Spacers 14 are formed on the sidewalls of the wiring lines 12. A preferred method of forming the spacers 14 comprises steps of forming a dielectric material on the wiring lines 12 and then etching back the dielectric material to form the spacers 14 on the sidewalls of the wiring lines 12.

Figure 2:
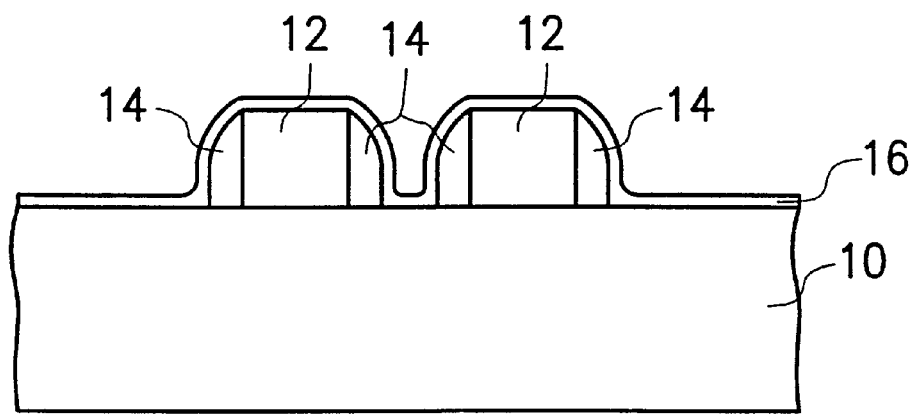

In FIG. 2, a first HDPCVD step is carried out to form a thin liner layer 16 onto the spacers 14 and the wiring lines 12. The liner layer 16 has a thickness of about 100–2000 Å. The first HDPCVD step is carried out with the substrate 10 being unbiased and unclamped so that there is a little or no etching taking place during deposition of the liner layer 16. Such conditions also mean that the deposition is substantially conformal, with a poor gap-filling capability. The primary purpose of this first HDPCVD step being carried out at a low etching to deposition rate is to form a highly conformal protective coating over the wiring lines 12.

Figure 3:
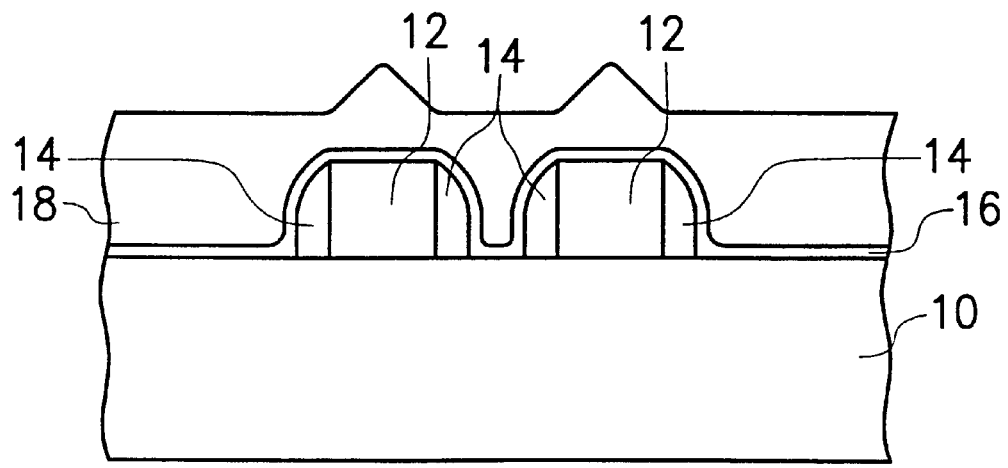

In FIG. 3, a second HDPCVD step is carried out with the substrate biased so that a dielectric layer 18 is formed to quickly fill the gaps between the wiring lines 12. The second HDPCVD step provides dielectric material over the top of the wiring lines 12 and provides dielectric material over the sidewalls of the spacer with high levels of gap filling. While carrying out the second HDPCVD step, the liner layer 16 protects the wiring lines from being damaged by the sputtering component of the second HDPCVD step.

In another aspect of the invention, the first HDPCVD step described above, (which includes the deposition of an HDPCVD liner layer without application of a sputter bias component) may be replaced with another dielectric layer using a conventional CVD process, such as PECVD. This is possible because the liner layer is not intended to fully fill the gap and thus is less significant. In addition, if the liner material overhangs the gap, that overhang will be etched during the subsequent HDPCVD step that utilizes a sputter bias component.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming dielectric layers applied on a substrate, comprising:

providing a plurality of wiring lines above the substrate, the wiring lines having spacers;

forming a conformal liner layer on the wiring lines and the spacers using high density plasma chemical vapor deposition, the substrate is unbiased and unclamped during formation of the conformal liner layer; and forming a dielectric layer on the liner layer using high density plasma chemical vapor deposition.

2. The method according to claim 1, wherein the liner layer comprises oxide.

3. The method according to claim 1, wherein the liner layer has a thickness of about 100–2000 Å.

4. The method according to claim 1, wherein the dielectric layer comprises oxide.

* * * * *